United States Patent [19]

Abe

[11] Patent Number: 5,023,498
[45] Date of Patent: Jun. 11, 1991

[54] FLEXIBLE CIRCUIT BOARD FOR MOTOR POSITION ADJUSTMENT

[75] Inventor: Youji Abe, Kiyose, Japan

[73] Assignee: Teac Corporation, Tokyo, Japan

[21] Appl. No.: 552,793

[22] Filed: Jul. 16, 1990

[30] Foreign Application Priority Data

Jul. 17, 1989 [JP] Japan .................................. 1-83722

[51] Int. Cl.[5] .......................... H02K 5/26; G11B 5/54
[52] U.S. Cl. ...................................... 310/71; 360/105; 361/408
[58] Field of Search .................. 29/596; 174/250, 254, 174/268, 117 F; 310/42, 71, 89, 240, DIG. 6; 360/105, 106, 109; 361/398, 408; 439/131, 926

[56] References Cited

U.S. PATENT DOCUMENTS

| | | | |
|---|---|---|---|
| 4,462,054 | 7/1984 | Dong et al. | 360/105 |
| 4,476,404 | 10/1984 | Bygdnes | 310/71 |
| 4,737,675 | 4/1988 | Maemine et al. | 310/71 |
| 4,845,315 | 7/1989 | Stopper | 361/408 |
| 4,864,348 | 9/1989 | Fujiwara | 361/398 |
| 4,870,311 | 9/1989 | Chase et al. | 310/71 |
| 4,901,193 | 2/1990 | Kinugawa | 361/398 |
| 4,965,684 | 10/1990 | Stefansky | 360/105 |

FOREIGN PATENT DOCUMENTS 62-18945  1/1987  Japan ..................................... 310/71

*Primary Examiner*—Steven L. Stephan
*Assistant Examiner*—D. L. Rebsch
*Attorney, Agent, or Firm*—Michael N. Meller

[57] ABSTRACT

A flexible circuit board (5) electrically connects an external circuit and a motor and is loosely wound around an outer surface of the motor. The body of the motor must be rotated at a time of adjusting a setting position. The flexible circuit board includes a first connection on one end of the flexible circuit board, a second connection on the other end of the flexible circuit board, the second connection being connected to the external circuit and a coupling provided between the first connection and the second connection, the coupling being loosely wound around the outer surface of the motor. The first connection includes a first portion fixed to a terminal block of the motor and a second portion integrated with the coupling and connecting the first portion and the coupling. The second portion is bent according to bending of the coupling when the first portion is fixed to the terminal block of the motor.

3 Claims, 6 Drawing Sheets

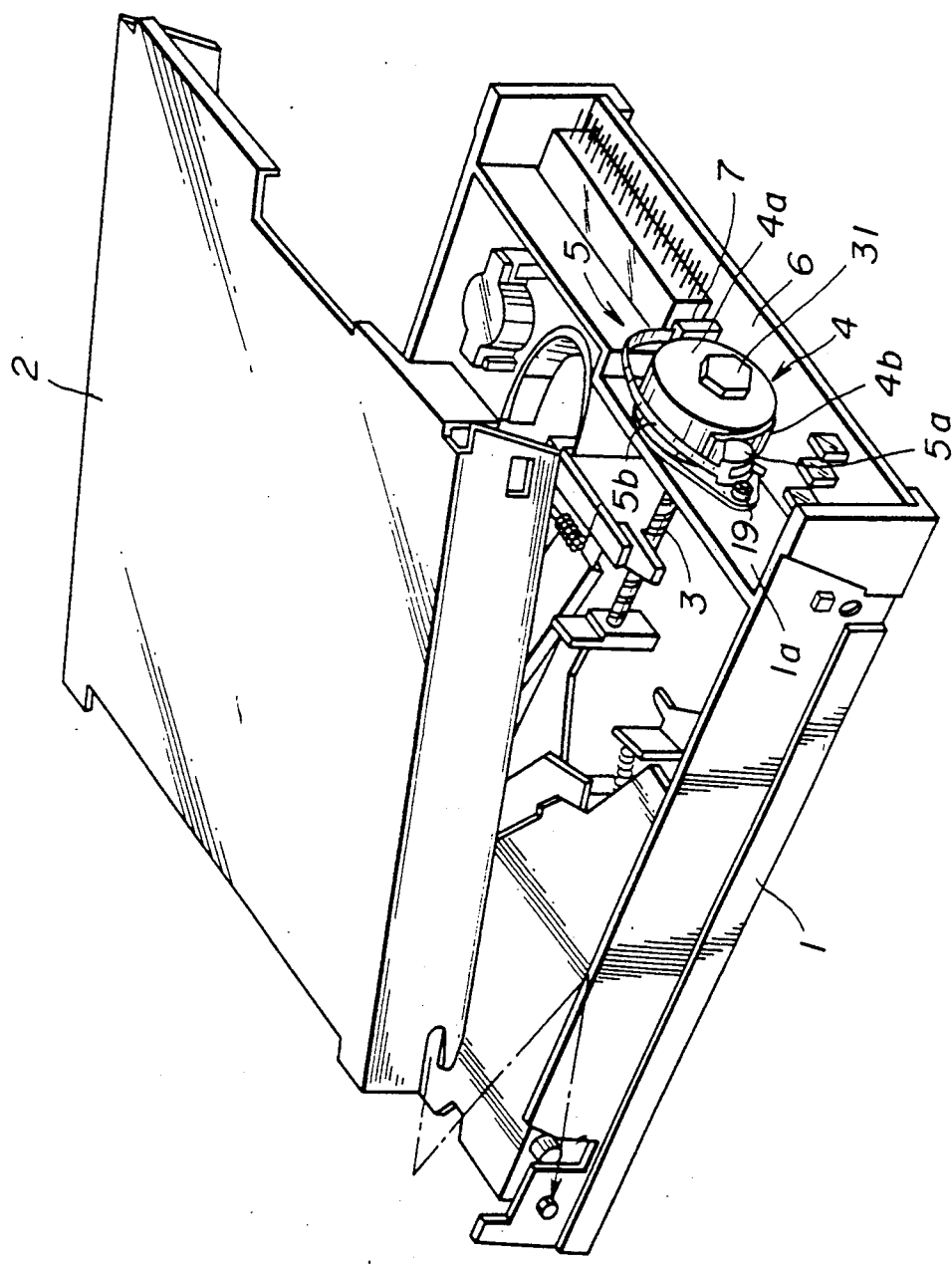

FLEXIBLE CIRCUIT BOARD FOR MOTOR POSITION ADJUSTMENT

BACKGROUND OF THE INVENTION

The present invention generally relates to a flexible circuit board, and more particularly to a flexible circuit board connecting another circuit board and a motor for which a body thereof must be rotated at time of adjusting a setting position thereof.

For example, in assembly processes of a magnetic disc unit, an alignment operation to determine an initial position of a head carriage supporting a magnetic head is performed. In this alignment operation, a magnetic disc for the alignment is loaded into the magnetic disc unit, the head carriage is properly moved for a distance less than a pitch of the tracks on the magnetic disc and the magnetic head is made to exactly face a reference track on the magnetic disc. Then, when the magnetic head has exactly faced the reference track, the alignment operation is over. In a case where the magnetic disc unit has a mechanism in which the head carriage is moved by a lead screw rotated by a stepping motor, the lead screw is properly rotated so that the alignment operation is performed. A constant voltage is applied to the stepping motor so that the motor shaft is magnetically locked. In this state, a body of the stepping motor is rotated around the center of the motor shaft at a small angle. Due to the rotation of the motor body, the lead screw is rotated.

The stepping motor is, for example, electrically connected to an external circuit by a flexible circuit board. A first connection portion at an end of the flexible board is fixed to terminals of the stepping motor by soldering or the like. A second connection portion at another end of the flexible board is connected to a connector on a printed circuit board on which a driving circuit of the stepping motor is formed. Then, a coupling portion of the flexible circuit board positioned between the first connection portion and the second connection portion is loosely wound around an outer surface of the stepping motor.

Since the stepping motor is rotated at a small angle at the time of the alignment operation, a distance between the first connection portion of the flexible circuit board and the second connection portion fixed to the printed circuit board changes. In other words, the degree of looseness of the coupling portion of the flexible circuit board changes according to the rotation position of the motor body. Thus, it is necessary to prevent the loose coupling portion of the flexible circuit board from interfering with other parts of the magnetic disc unit and from coming out of a housing of the magnetic disc unit. Japanese Laid-open Utility Model Application No. 1-165691 (The title of the invention is "A Guide Structure of a Flexible Circuit Board") discloses a structure having an engagement member with which the flexible circuit board is engaged on a base plate of the magnetic disc unit. Because of this structure's engagement member, it is possible to prevent the flexible circuit board from interfering with other parts of the magnetic disc unit and from coming out of the housing of the magnetic disc unit. However, in this proposed structure, it is necessary to particularly provide a guide member for guiding the flexible circuit board on the base plate of the magnetic disc unit so that the number of parts of the magnetic disc unit increases. Furthermore, the operation for making the loose portion of the flexible circuit board engage with the engagement member is required, so that the assembly operation of the magnetic disc unit is relatively troublesome.

In general, there are the same disadvantages, as has been described above, in a device having a flexible circuit board connecting another circuit board and a motor for which a body thereof must be rotated at the time of adjusting a setting position thereof.

SUMMARY OF THE INVENTION

Accordingly, a general object of the present invention is to provide a novel and useful flexible circuit board in which the disadvantages of the aforementioned prior art are eliminated.

A more specific object of the present invention is to provide a flexible circuit board which is capable of being suitably bent around a body of the motor without the engagement member.

The above objects of the present invention can be achieved by a flexible circuit board electrically connecting an external circuit and a motor and being loosely wound around an outer surface of the motor, wherein a body of the motor must be rotated at a time of adjusting a setting position, the flexible circuit board comprising a first connection portion provided on an end of the flexible circuit, a second connection portion provided on another end of the flexible circuit, the second connection portion being connected to the external circuit, and a coupling portion provided between the first connection portion and the second connection portion, the coupling portion being loosely wound around the outer surface of the motor, wherein the first connection portion comprises a first portion fixed to a terminal block which is povided on the outer surface of the motor, a second portion integrated with the coupling portion and connecting the first portion and the coupling portion, the second portion being bent in accordance with a bending of the coupling portion when the first portion is fixed to the terminal block of the motor.

Additional objects, features and advantages of the present invention will become apparent from the following detailed description when read in conjuction with the accompanying drawings.

BRIEF DESCRIPTION OF THE DRAWINGS

FIG. 1 is a perspective view showing a magnetic disc unit using an embodiment of the flexible circuit board according to the present invention;

DESCRIPTION OF THE PREFERRED EMBODIMENTS

Figure 2A:
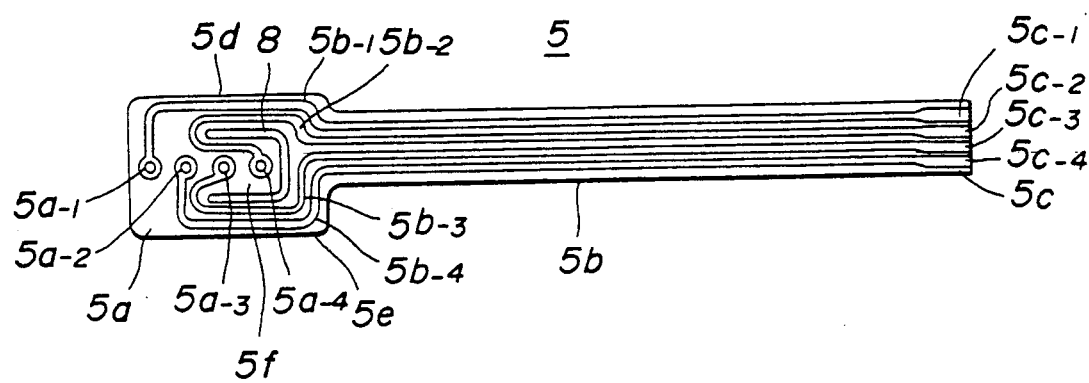
FIG. 2A is a plan view showing an embodiment of the flexible circuit board according to the present invention.
Figure 2B:
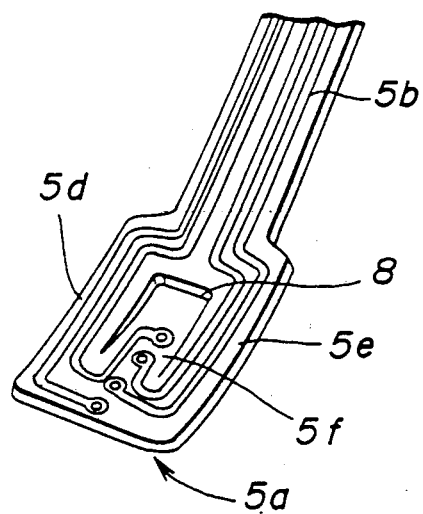
FIG. 2B shows a state where a connection portion of the flexible circuit is curved.

A description will now be given of a first embodiment of the present invention with reference to FIGS. 1 through 2B.

Referring to FIG. 1, a variety of mechanisms required for magnetic recording and reproducing are provided in a chassis 1. The chassis 1 is made by an aluminium die casting. A cover 2 covers an upper side of the chassis 1. The cover 2 prevents dust from entering into the chassis 1 and shields it from electromagnetic waves and the like. A stepping motor 4 is provided at a rear side of the chassis 1. The stepping motor 4 rotates lead screw 3 and is used for driving a head carriage. The stepping motor 4 is mounted on a rear side wall 1a of the chassis 1 and is capable of adjusting the rotation position thereof so that it is possible to align a head carriage supporting a magnetic head at the time of the assembly of the magnetic disc unit, as will be described later.

A flexible circuit board 5 is provided around an outer surface of the motor body 4a so as to be loosely wound. The flexible circuit board 5 has, as shown in FIG. 2A, a connection portion 5a formed at a end of the flexible circuit board 5, an insertion portion 5c formed at another end thereof and a coupling portion 5b positioned between the connection portion 5a and the insertion portion 5c. The connection portion 5a of the flexible circuit board 5 has terminals 5a-1 through 5a-4 arranged in a line. Each of the terminals 5a-1 through 5a-4 is connected to one of a plurality of pins on a terminal block 4a of the stepping motor 4 by soldering so that the connection portion 5a of the flexible circuit board 5 is fixed to the terminal block 4a of the stepping motor 4. The insertion portion 5c has terminals 5c-1 through 5c-4. The insertion portion 5c is inserted in a connector 7 provided on a base plate 6 of the chassis 1 so that each of the terminals 5c-1 through 5c-4 is electrically connected to one of the terminals of the connector 7.

A slit 8 is formed on the connection portion 5a of the flexible circuit board 5. The slit 8 is substantially C-shaped and surrounds terminals 5a-3 and 5a-4. Due to the C-shaped slit 8, the connection portion 5a is divided into arm parts 5d and 5e and a fixed part 5f. Conductive patterns 5b-1 through 5b-4 are formed on the flexible circuit board 5. Each of the conductive patterns 5b-1 through 5b-4 connects a corresponding one of terminals 5a-1 through 5a-4 provided on the connection portion 5a and a corresponding one of terminals 5c-1 through 5c-4 provided on the insertion portion 5c. The conductive patterns 5b-1 through 5b-4 are arranged so as to avoid the slit 8 on the connection portion 5a. When the coupling portion 5b of the flexible circuit board 5 is bent, at the connection portion 5a, arm parts 5d and 5e are bent at the same time, as shown in FIG. 2B. Thus, the coupling portion 5b of the flexible circuit board 5 is easily bent in accordance with the rotation position of the motor body 4a at the time of the alignment operation, as will be described later.

Figure 3:
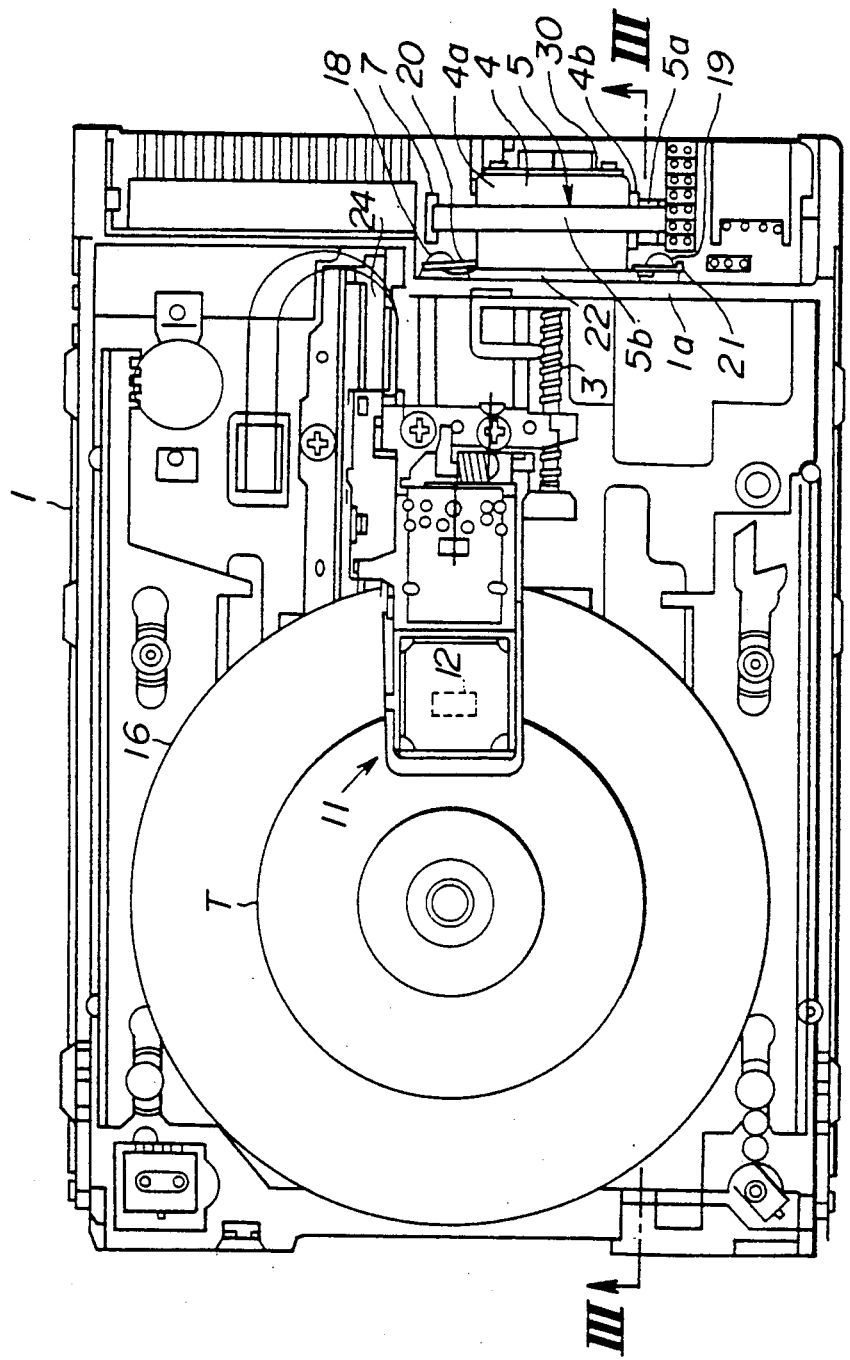
FIGS. 3 through 5 are, respectively, a plan view of the magnetic disc unit, a side view thereof and a rear view thereof.
Figure 4:
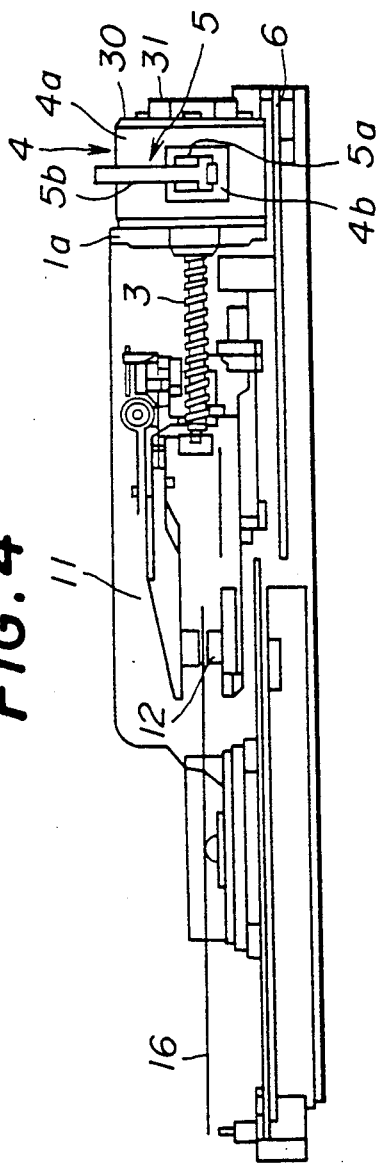
Figure 5:
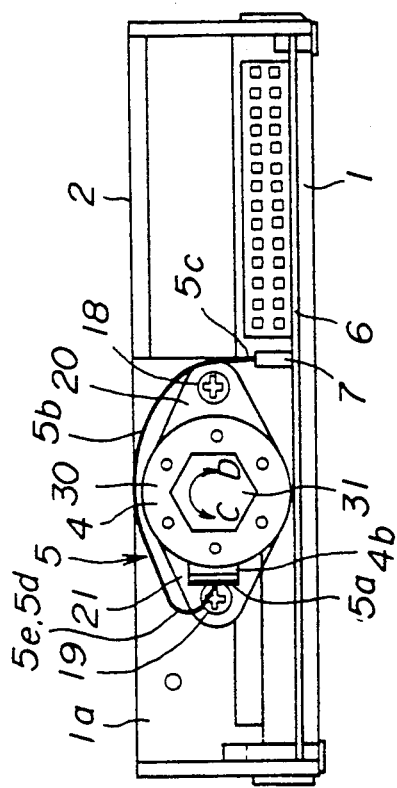

A description will now be given of the structure of the magnetic disc unit with reference to FIGS. 3 though 6.

Figure 6:
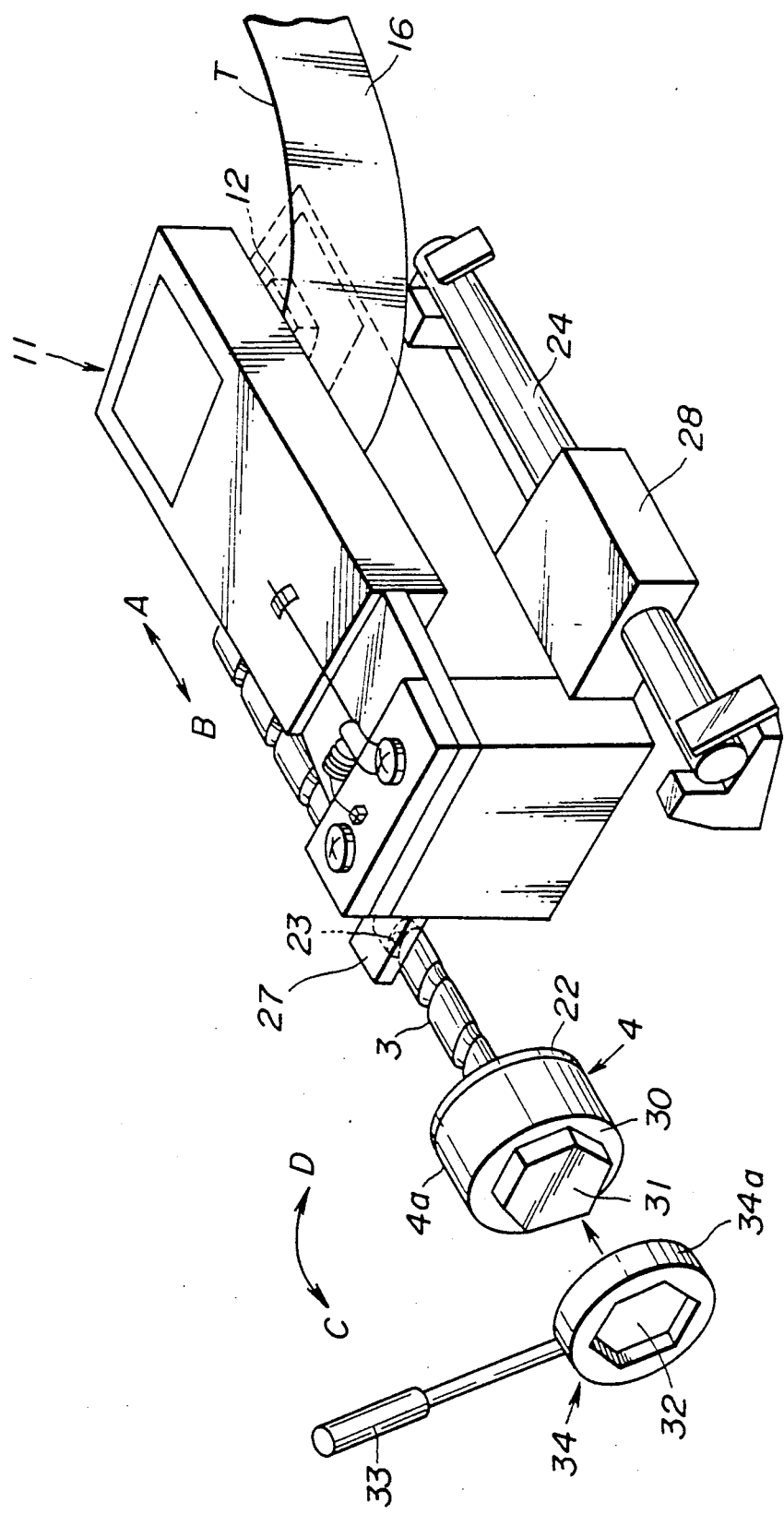
FIG. 6 is a perspective view explaining an alignment operation of a magnetic head.

The stepping motor 4 has a flange. The flange is pressed by clamping plates 20 and 21. The flange of the stepping motor 4 and the clamping plates 20 and 21 are fixed on the rear wall 1a of the chassis 1 by screws 18 and 19 so that the stepping motor 4 is fixed on the rear wall 1a of the chassis 1. A head carriage 11 having a magnetic head 12 is integrated with a block 28, as shown in FIG. 6. The block 28 is slidably fit with a guide rod 24 which is provided on the chassis 1 and lies in the directions shown by arrows (A) and (B). Thus, the head carriage 11 is capable of moving in the direction shown by the arrows (A) and (B). The directions shown by the arrows (A) and (B) are in accordance with radius directions of a magnetic disc loaded in the magnetic disc unit. An arm 27 projects from the head carriage 11. The arm 27 has a protrusion 23 made of resin which engages with a groove of the lead screw 3.

According to the structure described above, when the stepping motor 4 is driven and the lead screw 3 rotates, the head carriage 11 is guided by the guide rod 24 and moves in the directions shown by the arrows (A) and (B). Then, the magnetic head 12 records and reproduces data on and from the magnetic disc.

A description will now be given of the alignment operation which determines the initial position of the head carriage supporting the magnetic head 12 at the time of the assembly of the magnetic disc unit.

An end plate 30 is fixed on an end of the motor body 4a opposite to the lead screw 3. A protrusion 31 having a shape which is flat and hexagonal is formed on the center of the end plate 30. At the time of the alignment operation, the screws 18 and 19 are slightly loosened so that it becomes possible for the motor body 4a to be rotated by a suitable torque.

The magnetic disc 16 which is used when the alignment is performed is loaded into the magnetic disc unit and is rotated. Then, the magnetic disc unit is driven in a reproduction mode. A constant voltage is applied to the stepping motor 4 and a stator coil (not shown in FIG. 6) of the stepping motor 4 is magnetized so that a magnet (not shown in FIG. 6) which is a rotor of the stepping motor 4 is magnetically locked. That is, the lead screw 3 fixed on an end of the magnet is locked. In a state where the lead screw 3 is locked, the motor body 4a is suitably rotated in the directions shown by arrows (C) and (D). The motor body 4a is rotated by a jig 34. The jig 34 has, as shown in FIG. 6, a disc plate 34a of which a hexagonal-shaped hole 32 is formed in the center thereof and a handle 33 projects from the disc plate 34a. Then, the hexagonal-shaped hole 32 is fit on the protrusion 31 of the end plate 30 fixed on the motor body 4a, the disc plate 34a is rotated in the directions shown by the arrows (C) and (D) by the handle 33 so that the motor body 4a is rotated in the same directions. The motor body 4a is rotated as has been described above, and the lead screw 3 which is magnetically locked is also rotated at the same time in the directions shown by the arrows (C) and (D) so that the head carriage 11 is slightly moved in the corresponding directions shown by the arrows (A) and (B). An operation for moving the head carriage is performed while monitoring the level of a reproduction signal obtained through the magnetic head 12. Then, when the magnetic head 12 exactly faces to the reference track (T) on the magnetic disc 16 and the level of the reproduction signal reaches the maximum, the rotation of motor body 4a is stopped and the motor body 4a is securely screwed by the screws 18 and 19. When the motor body 4a is securely screwed, the alignment operation is completed.

Figure 7:
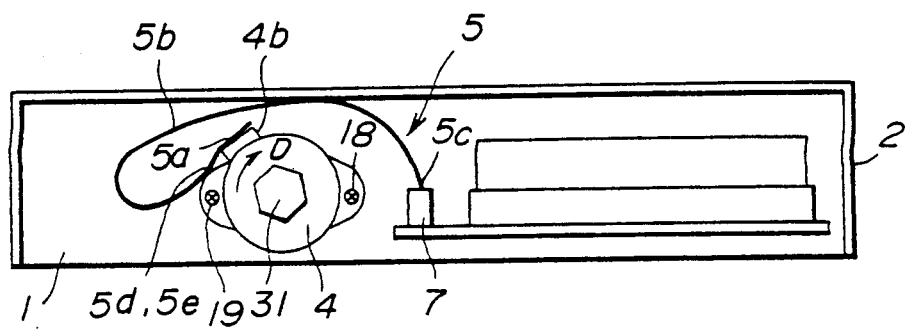
FIGS. 7 and 8 show loosened state of the flexible circuit board, the degree of which loosness changes in accordance with the rotation position of a stepping motor.

At the time of the alignment operation, the motor body 4a is rotated as has been described above. The coupling portion 5b of the flexible circuit board 5 is bent in accordance with the rotation position of the motor body 4a. When the coupling portion 5b is bent, the arm parts 5d and 5e of the connection portion 5a of the flexible circuit board 5 are also bent at the same time so that the bending state of the coupling portion 5b is adjusted. For example, as shown in FIG. 7, when the stepping motor 4 is rotated to a critical position in the direction shown by the arrow (D), the terminal block 4b of the stepping motor 4 moves toward the connector 7 so that the loose part of the flexible circuit board 5 becomes larger. In this case, the arm parts 5d and 5e of the flexible circuit board 5 are scarcely bent and are maintained in contact with the surface of the terminal block 4b, and most of the coupling portion 5b of the flexible circuit board 5 is bent between the case 2 and the stepping motor 4.

Figure 8:
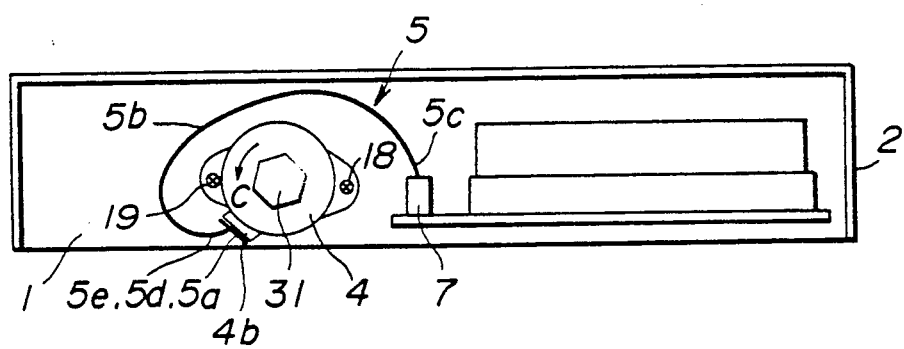

As shown in FIG. 8, when the stepping motor 4 is rotated to a critical position in the direction shown by the arrow (C), the terminal block 4b of the motor 4 moves in a direction separating it from the connector 7 so that the loose part of the flexible circuit board 5 becomes shorter. In this case, the coupling portion 5b of the flexible circuit board 5 is pulled in the direction shown by the arrow (C) so as to be wound around the motor body 4a. As a result, the arm parts 5d and 5e of the flexible circuit board 5 rise to the surface of the terminal block 4b and are bent in the same manner as the coupling portion 5b. Then, the flexible circuit board 5 is prevented from being pulled too much and coming into contact with the outer surface of the motor body 4a. The arm parts 5d and 5e are elastically bent according to the rotation position of the motor body 4a as has been described above so that the coupling portion 5b is always maintained in properly bent state.

According to the first embodiment, the flexible circuit board 5 is prevented from interfering with the other parts of the magnetic disc unit and coming out of the housing of the magnetic disc unit. In addition, it is unnecessary to provide the engagement member or the like for engaging the flexible circuit board 5 so that the magnetic disc unit can be assembled without an engagement operation of the flexible circuit board.

A description will now be given of a second embodiment according to the present invention with reference to FIG. 9. In a case where the motor body 4a is relatively thinner, the flexible circuit board 35 shown in FIG. 9 is used.

Figure 9:
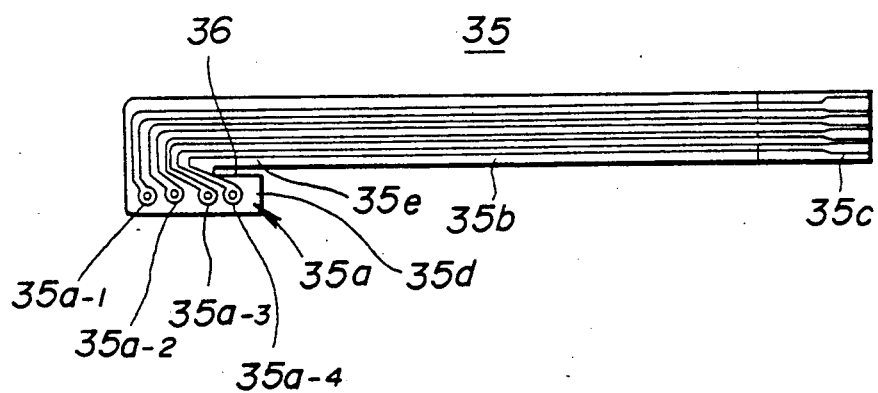
FIG. 9 is a plan view of another embodiment of the present invention.

Referring to FIG. 9, the flexible circuit board 35 has a connection portion 35a formed at an end thereof, a insertion portion 35c formed at another end thereof and coupling portion 35b positioned between the connection portion 35a and the insertion portion 35c. Terminals 35a-1 through 35a-4 are formed on the connection portion 35a in the same manner as the first embodiment. A slit 36 is formed on the connection portion 35a parallel to the coupling portion 35b so that the connection portion 35a is divided into a fixed part 35d and a free part 35e. That is, the slit 36 extends from a side edge of the coupling porition 35b, and the fixed part 35d has a portion which is separated from the free part 35e by the slit 36.

The fixed part 35d of the flexible circuit board 35 is fixed to the terminal block of the stepping motor 4 and the insertion portion 35c of the flexible circuit board 35 is inserted in the connector 7. At the time of the alignment operation, the free part 35e of the flexible circuit board 35 is elastically bent in accordance with the rotation position of the motor body 4a so that the coupling portion 35b is always maintained in a properly bent state, in the same manner as the first embodiment.

In each of the above embodiment, the motor body is rotated and the alignment operation is performed at the time of the assembly of the magnetic disc unit. At this time, parts, such as arm parts 5d and 5e and the free part 35e, of the connection portion of the flexible circuit board is elastically bent so as to adjust the bending of the coupling portion of the flexible circuit board. Thus, it is possible to prevent the coupling portion from bending too much and from pulling too much. It is also possible to prevent the coupling portion from interfering with other parts of the magnetic disc unit and from coming out of the housing of the magnetic disc unit. In addition, it is unnecessary to provide the engagement member for engaging the flexible circuit board so that it is possible to assemble the magnetic disc unit without the engagement operation of the flexible circuit board. Thus, it is possible to simplify the assembly process and to increase an efficiency of the assembly process.

In general, the same advantages as described above are obtained in a flexible circuit board connecting another circuit and a motor for which a body thereof must be rotated at the time of adjusting the setting position thereof.

The present invention is not limited to the aforementioned embodiments, and variations and modifications may be made without departing from the scope of the claimed invention.

What is claimed is:

1. A flexible circuit board electrically connecting an external circuit and a motor and loosely wound around an outer surface of the motor, wherein a body of said motor must be rotated at a time of adjusting a setting position thereof, said flexible circuit board comprising:
   a first connection portion provided on an end of said flexible circuit;
   a second connection portion provided on another end of said flexible circuit, said second connection portion being connected to said external circuit; and
   a coupling portion provided between said first and second connection portions, said coupling portion being loosely wound around the outer surface of said motor,
   said first connection portion comprising:
   a first portion fixed to a terminal block which is provided on the outer surface of said motor, and
   a second portion integrated with said coupling portion and connecting said first portion and said coupling portion, said second portion being bent in accordance with bending of said coupling portion when said first portion is fixed to said terminal block of said motor,
   wherein said first connection portion has a slit which divides said first connection portion into said first and second portions.

2. A flexible circuit board as claimed in claim 1, wherein said slit is substantially C-shaped and is formed on a central part of said first connection portion so that said first portion has a portion surrounded by said slit and said second portion is positioned outside said slit.

3. A flexible circuit board as claimed in claim 1, wherein said second portion of said first connection portion extends from said coupling portion, and said first portion of said first connection portion projects from said second portion,
   wherein said first portion has a portion which is separated from said second portion by said slit, said slit extending from a side of said coupling portion.

* * * * *